(12) United States Patent
Gasse et al.

(10) Patent No.: US 11,495,710 B2
(45) Date of Patent: Nov. 8, 2022

(54) METHOD FOR PRODUCING A PATTERNED LAYER OF MATERIAL

(71) Applicant: COMMISSARIAT A L'ENERGIE ATOMIQUE ET AUX ENERGIES ALTERNATIVES, Paris (FR)

(72) Inventors: Adrien Gasse, Grenoble (FR); Amélie Dussaigne, Grenoble (FR); François Levy, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/109,388

(22) Filed: Dec. 2, 2020

(65) Prior Publication Data

US 2021/0184078 A1   Jun. 17, 2021

(30) Foreign Application Priority Data

Dec. 11, 2019  (FR) ...................................... 19 14172

(51) Int. Cl.
*H01L 33/22* (2010.01)
*H01L 25/075* (2006.01)
(Continued)

(52) U.S. Cl.
CPC .......... *H01L 33/22* (2013.01); *H01L 25/0753* (2013.01); *H01L 33/0093* (2020.05);
(Continued)

(58) Field of Classification Search
None
See application file for complete search history.

(56) References Cited

U.S. PATENT DOCUMENTS

2008/0008969 A1   1/2008  Zhou et al.
2010/0072489 A1*  3/2010  McLaurin ............. H01L 27/156
                                                                257/88
(Continued)

FOREIGN PATENT DOCUMENTS

EP   2 466 562 A1   6/2012
EP   3 365 924 A1   8/2018
(Continued)

OTHER PUBLICATIONS

French Preliminary Search Report dated Jul. 21, 2020 in French Application 19 14172 filed Dec. 11, 2019 (with English Translation of Categories of Citing Documents), 2 pages.

(Continued)

*Primary Examiner* — Robert K Carpenter
(74) *Attorney, Agent, or Firm* — Oblon, McClelland, Maier & Neustadt, L.L.P.

(57) ABSTRACT

A method for producing a patterned layer of material includes producing a first substrate having a patterned face, producing, against the patterned face of the first substrate, a stack of layers having an intermediate layer and the layer to be patterned, the intermediate layer being disposed between the layer to be patterned and the first substrate, a first face of the intermediate layer disposed on the first substrate side being patterned in accordance with a design that is the inverse of that of the patterned face of the first substrate, and removing the first substrate. The intermediate layer is anisotropically etched from the first face of the intermediate layer, and at least part of the thickness of the layer to be patterned is etched, patterning a face of the layer to be patterned in accordance with the design of the first face of the intermediate layer.

23 Claims, 6 Drawing Sheets

(51) Int. Cl.
*H01L 33/00* (2010.01)
*H01L 33/30* (2010.01)
*H01L 33/32* (2010.01)
*H01L 33/62* (2010.01)

(52) U.S. Cl.
CPC .......... *H01L 33/0095* (2013.01); *H01L 33/30* (2013.01); *H01L 33/32* (2013.01); *H01L 33/62* (2013.01); *H01L 2933/0066* (2013.01)

(56) References Cited

U.S. PATENT DOCUMENTS

| | | |
|---|---|---|
| 2017/0338114 A1 | 11/2017 | Choi et al. |
| 2017/0365485 A1 | 12/2017 | Pratt et al. |
| 2019/0228967 A1 | 7/2019 | Sotta et al. |
| 2019/0263024 A1* | 8/2019 | Kobayashi ............ G03F 7/0002 |
| 2020/0035864 A1* | 1/2020 | Chambion .............. H01L 33/08 |
| 2020/0343296 A1* | 10/2020 | Gasse ................... H01L 27/156 |
| 2020/0403130 A1* | 12/2020 | Volpert .................. H01L 33/60 |

FOREIGN PATENT DOCUMENTS

| | | |
|---|---|---|
| FR | 3 056 825 A1 | 3/2018 |
| WO | WO 2018/060570 A1 | 4/2018 |

OTHER PUBLICATIONS

Kim, J-Y. et al., "Enhancement of light extraction from GaN-based green light-emitting diodes using selective area photonic crystal," Applied Physics Letters, vol. 96, No. 251103, 2010, https:///doi.org/10.1063/1.3454240, 4 pages.

* cited by examiner

METHOD FOR PRODUCING A PATTERNED LAYER OF MATERIAL

TECHNICAL FIELD

This document relates to the production of patterns, or textures, in a layer of material advantageously corresponding to a III-V semiconductor layer or advantageously forming part of a stack of layers comprising a III-V semiconductor layer. It advantageously applies to the production of emissive semiconductor devices such as electroluminescent diodes, or LEDs, comprising a III-V semiconductor, and wherein the patterns form elements or designs for extracting the light generated by the devices.

PRIOR ART

Known methods involve producing LEDs from substrates of the type GaNOS ("GaN On Sapphire") or InGaNOS ("InGaN On Sapphire"), i.e. comprising GaN or InGaN islands on a sapphire substrate. A problem encountered with such LEDs, as well as with any LED produced with GaN or InGaN is that the GaN and InGaN forming the emissive materials of these LEDs are materials with high refractive indices which differ significantly from that of the environment in which the LEDs operate (air or encapsulating material such as a polymer). A significant part of the light generated by these LEDs thus remains trapped in the GaN or InGaN and is not emitted. This problem is even greater if substrates of the type GaNOS or InGaNOS are used since photons are also trapped in the oxide layers and the sapphire layers of these substrates.

The extraction of the light generated by the LEDs can be enhanced using patterned sapphire substrates, or PSS.

This light extraction can be further enhanced by patterning, or texturing, the GaN or InGaN of the LEDs. Such a patterning of the GaN or InGaN is generally carried out by lithography, once the components have been produced. The implementation of this patterning is, however, problematic in terms of alignment, compatibility with the contact metals or risks of damage. Moreover, in the case of GaNOS or InGaNOS substrates, the thickness of the semiconductor to be patterned is low (typically <1 µm), which makes conventional photolithography operations critical.

Alternatively, the document entitled "Enhancement of light extraction from GaN-based green light-emitting diodes using selective area photonic crystal" by J. Y. Kim et al., APPLIED PHYSICS LETTERS 96, 251103, 2010, proposes patterning a GaN layer of LEDs via a "nanoimprint" type lithography process. As with photolithography, this technique requires critical alignment on the components produced. Moreover, the use of a high force to pattern the resins could also cause damage to the components produced.

The problems described hereinabove also apply when a pattern must be produced in a III-V semiconductor layer that is not made of GaN or InGaN, and more generally in a layer of material.

DESCRIPTION OF THE INVENTION

Thus there is a need to propose a method for producing at least one patterned layer of material which does not have the aforementioned drawbacks, in particular those resulting from the implementation of a lithography step, and which does not require alignment between these patterns and the devices produced with such a patterned layer.

For this purpose, one embodiment proposes a method for producing at least one patterned layer of material, comprising at least the following steps of:

producing a first substrate having at least one patterned face;

producing, against the patterned face of the first substrate, a stack of layers comprising at least one intermediate layer and the layer of material intended to be patterned, such that the intermediate layer is disposed between the layer of material intended to be patterned and the first substrate, and such that a first face of the intermediate layer disposed on the patterned face side of the first substrate is patterned in accordance with a design that is the inverse of that of the patterned face of the first substrate;

removing the first substrate;

anisotropic etching the intermediate layer, implemented from the first face of the intermediate layer until parts of a face of the layer of material intended to be patterned are no longer covered by the intermediate layer and until remaining portions of the intermediate layer form a pattern, the design whereof corresponds to that of the first face of the intermediate layer; and etching the remaining portions of the intermediate layer and at least part of the thickness of the layer of material intended to be patterned, patterning said face of the layer of material intended to be patterned in accordance with the design of the first face of the intermediate layer.

Compared to the methods of the prior art, this method does not require the implementation of a photolithography process during the final step, which prevents damage to any semiconductor devices near the patterned layer.

Moreover, no alignment is necessary between the patterns produced and the devices then produced with the patterned layer of material.

Throughout this document, the terms "patterns" or "patterned" refer to the production of portions that protrude from the surface on which these portions are located and forming recesses therebetween.

Advantageously, the patterned layer of material may contain at least one III-V semiconductor, and preferably one of the following semiconductors: GaN, InGaN, AlGaN, InP, GaP, GaAs, InGaAs, AlGaS, AlGaInN, or AlGaInP.

The patterned layer of material may correspond to a stack of a plurality of layers of materials.

The method may be such that:

the first substrate may contain sapphire, the stack of layers produced against the patterned face of the first substrate may further include a release layer, for example containing nitride, disposed between the first substrate and the intermediate layer and such that a face of the release layer disposed on the intermediate layer side is patterned according to a design that is similar to that of the patterned face of the first substrate, and the release layer may be removed when the first substrate is removed by laser lift-off (LLO), or the first substrate may contain a semiconductor, or any other material that is for example non-transparent, and may be removed by planarization and chemical etching that is selective relative to the intermediate layer. A so-called "non-transparent" material corresponds in this case to a material that is not adapted to allow a laser to pass therethrough.

Moreover, the first substrate may correspond to any type of substrate capable of being patterned and removed while preserving the texturing designs in the intermediate layer. In this case, the removal of the first substrate may take place by implementing different steps of a laser lift-off process.

The first substrate may correspond to a PSS.

The intermediate layer may contain a semiconductor oxide, for example $SiO_2$.

Advantageously, the anisotropic etching process may be a reactive-ion etching process.

According to one advantageous embodiment, the patterned face of the first substrate may have protruding portions, the side walls whereof form, with the surface of the first substrate on which the protruding portions are disposed, angles of greater than or equal to 90°, and/or the shape whereof may be pyramidal or conical or frustoconical or dome-shaped. Such patterns present the advantage of easing the removal of the first substrate, i.e. the separation of the first substrate from the intermediate layer.

The stack of layers produced against the patterned face of the first substrate may further include a second substrate such that the layer of material intended to be patterned is disposed between the second substrate and the intermediate layer. This second substrate may form, at the end of the method, the carrier on which the patterned layer of material is disposed.

The production of the stack of layers against the patterned face of the first substrate may include at least the following steps of:
  producing a first part of the intermediate layer against the patterned face of the first substrate;
  producing the layer of material intended to be patterned on the second substrate;
  producing a second part of the intermediate layer on said face of the layer of material intended to be patterned; and
  rigidly connecting the first part of the intermediate layer to the second part of the intermediate layer, forming the intermediate layer.

The first and second parts of the intermediate layer may each contain a semiconductor oxide, and the rigid connection of the first part of the intermediate layer to the second part of the intermediate layer may correspond to direct bonding.

The second substrate may contain sapphire, or a semiconductor such as silicon.

Advantageously:
  the stack of layers produced against the patterned face of the first substrate may further include a release layer, for example containing nitride, disposed between the first substrate and the intermediate layer and such that a face of the release layer disposed on the intermediate layer side is patterned according to a design that is similar to that of the patterned face of the first substrate; and
  the release layer may be eliminated when the first substrate is removed.

During the production of the stack of layers against the patterned face of the first substrate, the layer of material intended to be patterned may be produced in the form of islands.

One embodiment relates to a method for producing electroluminescent diodes, or LEDs, including the implementation of a method for producing a patterned layer of material as described hereinabove. The patterns produced in the layer of material advantageously increase the extraction of the light created in the LEDs, in particular when the LEDs contain GaN and/or InGaN.

The method for producing the patterned layer of material is advantageous when implemented during the production of LEDs since it allows patterns to be produced with an extraction gain that depends little on the wavelength emitted by the LEDs, and which are also adapted to LEDs of small dimensions since the patterns produced can be shallow.

The patterns of the patterned layer of material may be ordered or otherwise. These patterns may be diffractive or refractive.

The production of the stack of layers may further include the production of p-n junctions and active regions of the LEDs including the production of semiconductor layers formed by epitaxy on the layer of material intended to be patterned, and the production of electrodes electrically connected to the p-n junctions.

The stack of layers produced against the patterned face of the first substrate may further include a second substrate such that the p-n junctions and the active regions are disposed between the second substrate and the intermediate layer, the second substrate being capable of comprising an electronic control circuit to which the electrodes are connected.

The method may further include, between the production of the electrodes and the production of the second substrate, the implementation of a step of cutting LED modules, each including one or more LEDs, one or more modules being then individually or collectively rigidly connected to the second substrate.

BRIEF DESCRIPTION OF THE FIGURES

The present invention will be better understood after reading the following description of example embodiments, given for purposes of illustration only and not intended to limit the scope of the invention, with reference to the accompanying figures, wherein.

Identical, similar or equivalent parts of the different figures described hereinbelow bear the same reference numerals in order to ease passage from one figure to another.

The different parts shown in the figures are not necessarily displayed according to a uniform scale in order to make the figures easier to read.

The different possibilities (alternatives and embodiments) must be understood as not being exclusive with regard to one another and can be combined with one another.

DETAILED DESCRIPTION OF SPECIFIC EMBODIMENTS

A method for producing a patterned layer of material 100 according to a first embodiment is described hereinbelow with reference to FIGS. 1 to 7.

Figure 1:
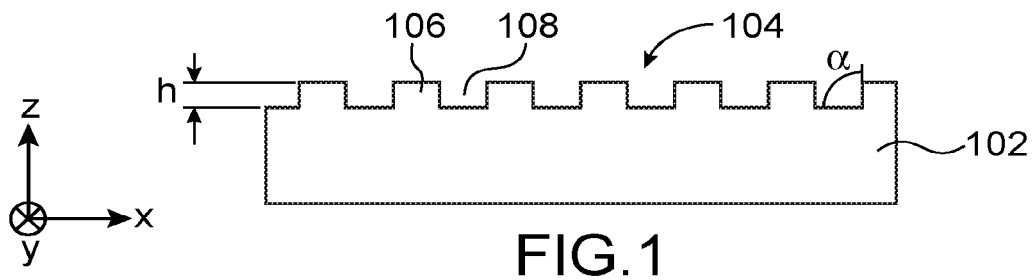
FIGS. 1-7 show the steps of a method for producing a patterned layer of material according to a first embodiment.
Figure 2:
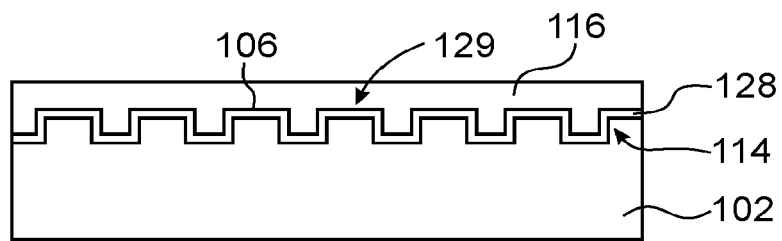

A first step of the method corresponds to producing, or supplying, a first substrate 102 having at least one patterned face 104 (see FIG. 1). This first substrate 102 corresponds, for example, to a PSS, or patterned or textured sapphire substrate. The patterned face 104 corresponds, in this case, to one of the two main faces of the first substrate 102, i.e. one of the two largest faces of the substrate 102.

This first substrate 102 is, for example, circular and has, for example, a diameter equal to 150 mm and a thickness equal to 1 mm. Other shapes and/or dimensions are possible.

The patterned face 104 of the first substrate 102 includes protruding portions 106 and recesses 108 located between these protruding portions 106. The height "h" of the protruding portions 106, i.e. the dimension of the protruding portions 106 relative to the surface at which the bases of the protruding portions 106 are located (dimension along the Z axis shown in FIG. 1), and which further corresponds to the depth of the recesses 108, is selected as a function of the thickness of the layer of material 100 in which the patterns are intended to be produced, as well as the purpose of these patterns (for example as a function of the wavelength of the light intended to be extracted by these patterns). In some cases, this height "h" of the protruding portions 106 may be less than or equal to the thickness of the layer of material 100.

According to one specific example embodiment such as that shown in FIG. 1, the design of the patterned face 104 may correspond to one or more arrays of pillars corresponding to the protruding portions 106, or to one or more arrays of holes corresponding to the recesses 108. Each pillar has, for example, in a plane parallel to the patterned face 104 (plane parallel to the plane (X, Y) in FIG. 1), or plane parallel to the main faces of the first substrate 102, a polygonal cross-section, which is for example rectangular, square or triangular, or circular or ovoid, or of any other shape. Advantageously, the protruding portions 106 have a pyramidal or conical or frustoconical shape or are dome-shaped. For the purposes of illustration, each protruding portion 106 has a conical shape of height h equal to 200 nm, and the base whereof has a diameter equal to 400 nm, and two neighbouring protruding portions 106 are spaced apart from one another, at the base thereof, by a distance equal to 200 nm. More generally, two neighbouring protruding portions 106 may be spaced apart from one another by a distance that is substantially equal to the height of these protruding portions 106. In general, the dimensions (height, diameter, side, spacing, etc.) of the protruding portions 106 may be less than 1 µm.

The one or more techniques implemented to produce the patterned face 104 in particular depend on the one or more materials of the first substrate 102 as well as on the shape and dimensions of the patterns to be produced on the patterned face 104. The patterns on the patterned face 104 may be produced for example by electron-beam lithography, by UV lithography, or by nanoimprint lithography, without the need for specific alignment on the substrate. When this first substrate 102 contains sapphire, the etching of the sapphire implemented to produce the patterns on the patterned face 104 may be a reactive-ion etching process, for example of the ICP type, implemented with etchants containing chlorine such as $BCl_3$.

In general, the dimensions and shape of the protruding portions 106 and of the recesses 108 are selected as a function of the properties sought after for the patterns intended to be produced in the layer of material 100 intended to be patterned, i.e. of the one or more intended purposes of these patterns. When the patterned layer of material 100 is intended to form a part of LEDs, these patterns may advantageously be used to enhance the extraction of the light emitted by the LEDs. In such a case, the shape, dimensions and spacing between the protruding portions 106 are selected in particular as a function of the wavelength of the light intended to be emitted by the LEDs.

During the method described herein, the first substrate 102 is intended to be released from another material produced on the patterned face 104 side. In order to facilitate this release, the protruding portions 106 are produced such that the side walls thereof form, with the surface of the first substrate 102 on which the protruding portions 106 are disposed, angles of greater than or equal to 90°. In FIG. 1, this angle is designated by the letter "a" and is equal to 90°. This improved release of the first substrate 102 is also obtained when the protruding portions 106 have a pyramidal or conical or frustoconical shape or a dome shape.

A stack 110 of layers comprising at least one intermediate layer 112 and the layer of material 100 intended to be patterned is produced against the patterned face 104 of the first substrate 102. This stack 110 is such that the intermediate layer 112 is disposed between the layer of material 100 and the first substrate 102, and such that a first face 114 of the intermediate layer 112 disposed on the patterned face 104 side of the first substrate 102 is patterned in accordance with a design that is the inverse of that of the patterned face 104 of the first substrate 102.

In the first embodiment described herein, since the first substrate 102 corresponds to a sapphire substrate intended to be released by laser lift-off, the stack 110 further includes a sacrificial release layer 128 disposed between the first substrate 102 and the intermediate layer 112. This release layer 128 is produced against the patterned face 104 of the first substrate 102, and a first part 116 of the intermediate layer 112 is produced against the release layer 128. The release layer 128 is produced such that a face 129 of the release layer 128 disposed on the intermediate layer 112 side is patterned according to a design that is similar to that of the patterned face 104 of the first substrate 102. The release layer 128 may contain a nitride-based material, such as, for example, $Si_3N_4$, GaN, AlGaN, AlN, etc. The first part 116 of the intermediate layer 112 corresponds, in this case, to a semiconductor oxide layer, for example $SiO_2$, deposited on the protruding portions and in the holes formed by the release layer 128 (see FIG. 2). This first part 116 of the intermediate layer 112 forms the first face 114 of the intermediate layer 112 disposed on the patterned face 104 side of the first substrate 102. This first patterned face 114 has protruding portions disposed inside the holes 108 in the patterned face 104 of the first substrate 102, and holes in which the protruding portions 106 of the patterned face of the first substrate 102 are disposed.

In parallel to the production of this first part 116 of the intermediate layer 112, the layer of material 100 is produced on a second substrate 118. Advantageously, the material of the layer 100 corresponds to a III-V semiconductor, and for example, to at least one of the following semiconductors: GaN, InGaN, InP, AlGaN, AlGaInN, AlGaInP, InP, GaP, GaAs, InGaAs, or AlGaS. Advantageously, the III-V semiconductor of the layer 100 corresponds to GaN or InGaN, or $In_xGa_{(1-x)}N$ where $0 \leq X \leq 0.5$. Alternatively, the layer 100 could contain other types of materials. The layer 100 may also correspond to a stack of a plurality of layers of materials disposed on top of one another. Moreover, in this first embodiment, the second substrate 118 contains sapphire. Alternatively, the second substrate 118 may contain a semiconductor, for example silicon.

Figure 3:
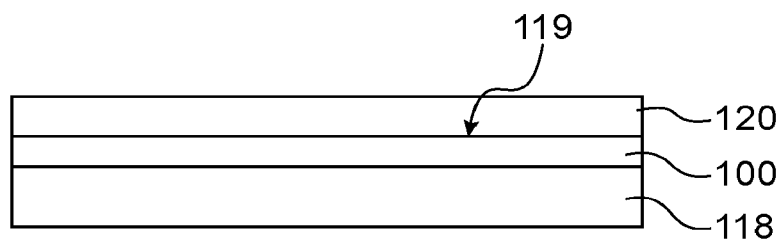
Figure 4:
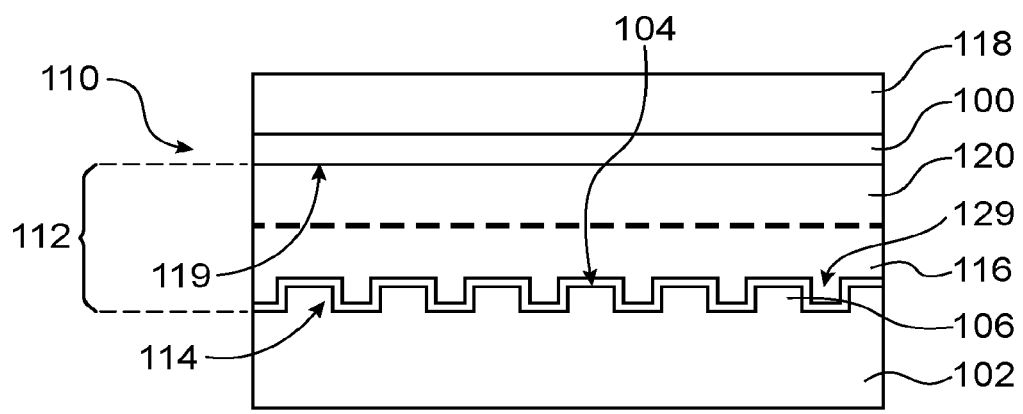

A second part 120 of the intermediate layer 112 is produced on the layer 100, against a face 119 of the layer 100 (see FIG. 3). Similarly to the first part 116, the second part 120 may correspond to a semiconductor oxide layer, for example SiO$_2$.

The first and second parts 116, 120 are then rigidly connected to one another, for example by direct bonding. This rigid connection forms the intermediate layer 112 (see FIG. 4).

At the end of these steps, the stack 110 obtained, which in this case includes the release layer 128, the intermediate layer 112, the layer of material 100 intended to be patterned and the second substrate 118, is effectively disposed against the patterned face 104 of the first substrate 102. Alternatively, the stack 110 may include additional layers of materials and/or not include the second substrate 118.

Figure 5:
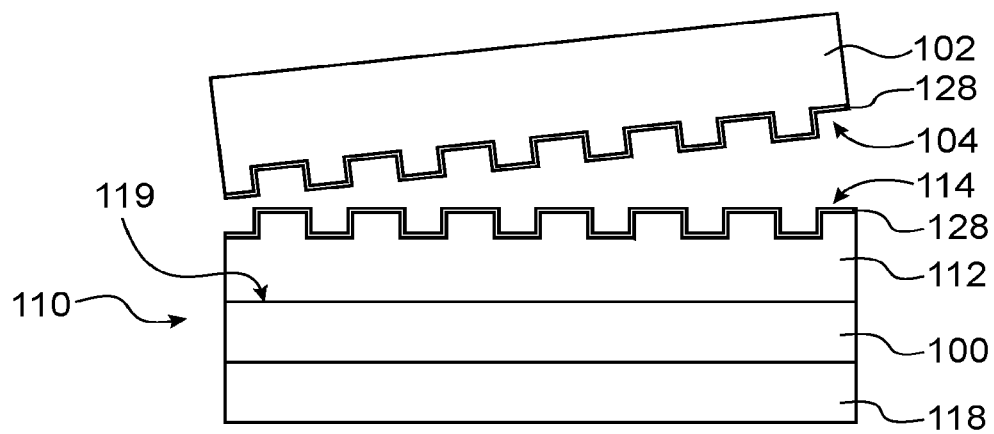
Figure 6:
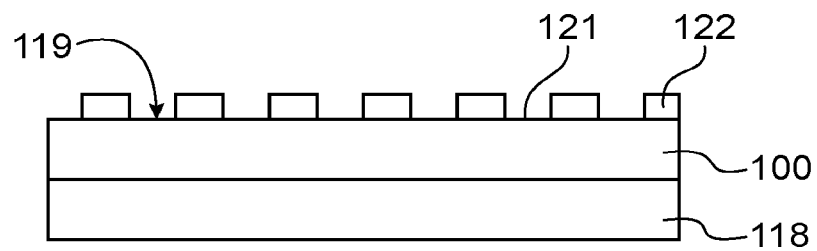
Figure 7:
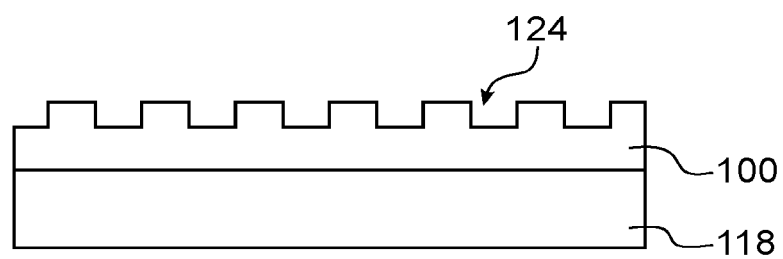

The first substrate 102 is then removed, i.e. separated from the stack 110 (see FIG. 5). In the first embodiment described here, since the first substrate 102 contains sapphire, this removal is advantageously carried out by laser lift-off through the first substrate 102. During this laser lift-off process, the release layer 128 absorbs the laser radiation and becomes separated to allow the first substrate 102 to be released. Remains of the release layer 128 present on the intermediate layer 112 are then removed by implementing a process for selectively etching said remains relative to the material of the intermediate layer 112. The implementation of such a laser lift-off process is described in detail, for example, in the document FR 3 079 657 A1.

After this removal, the first patterned face 114 of the intermediate layer 112 which was disposed on the patterned face 104 side of the first substrate 102 is exposed, i.e. not covered by any other material.

The method is then continued in order to transfer the patterns from the first face 114 of the intermediate layer 112 into the layer of material 100. This transfer is carried out by implementing an anisotropic etching of the intermediate layer 112 and of at least part of the thickness of the layer of material 100 implemented from the first face 114 of the intermediate layer 112. This etching patterns the face of the layer of material 100 located on the intermediate layer 112 side in accordance with the design of the first face 114 of the intermediate layer 112.

One possibility for carrying out such a transfer of patterns from the first face 114 of the intermediate layer 112 as far as the layer of material 100 involves implementing a first anisotropic etching of the intermediate layer 112 from the first face 114 thereof. This first etching may be stopped when parts 121 of the face 119 of the layer of material 100 are no longer covered by the intermediate layer 112 and when remaining portions 122 of the intermediate layer 112 form a structure, the design whereof corresponds to that of the patterns present on the first face 114 of the intermediate layer 112 (see FIG. 6). This first anisotropic etching process corresponds, for example, to a reactive-ion etching process, for example of the ICP (Inductively Coupled Plasma) type using fluorinated plasma such as CHF$_3$. Since this first etching process is anisotropic, the patterns initially present at the first face 114 of the intermediate layer 112 are effectively transferred as far as the layer of material 100.

The pattern of the layer of material 100 is completed by implementing a second etching of the remaining portions 122 of the intermediate layer 112 and of at least part of the thickness of the layer of material 100, through the face 119 of the layer of material 100. The implementation of this second etching process patterns the face 119 of the layer of material 100 against which the intermediate layer 112 was disposed, in accordance with the design of the first face 114 of the intermediate layer 112. The patterned face of the layer of material 100 obtained is denoted by the reference numeral 124 in FIG. 7. This second etching process corresponds, for example, to a plasma etching process implemented using chlorinated plasma.

Figure 8:
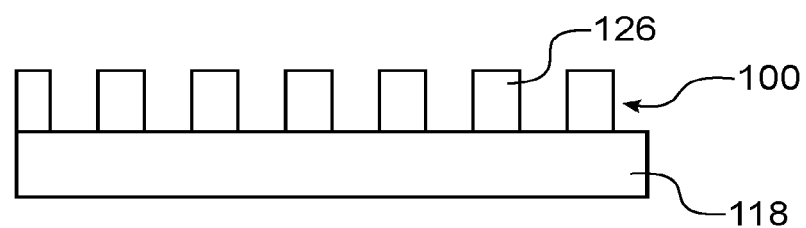
FIG. 8 shows the structure obtained by implementing a method for producing a patterned layer of material according to an alternative to the first embodiment.

In the first embodiment described hereinabove, the patterns of the layer of material 100 are produced in a part of the thickness of the layer 100. Alternatively, these patterns may be produced through the entire thickness of the layer of material 100. This patterning of the entire thickness of the layer of material 100 may be obtained by extending the duration of the second etching process described hereinabove. FIG. 8 shows the structure obtained according to this alternative embodiment, wherein the layer 100 is thus formed by a plurality of separate portions 126 disposed alongside one another and the dimensions and shapes whereof and the spacings between which are defined by the initial design of the patterned face 104 of the first substrate 102. This alternative embodiment is advantageously implemented when the layer of material 100 to be patterned corresponds to a stack of a plurality of layers of materials forming a part of LEDs.

Figure 9:
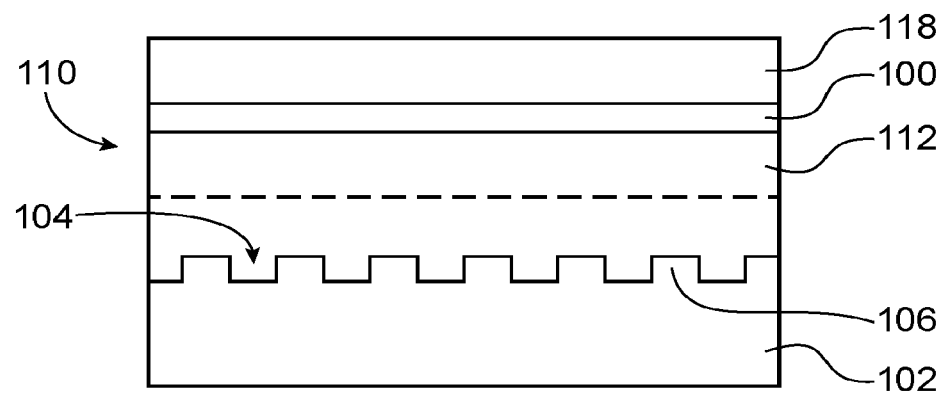
FIG. 9 shows an intermediate structure obtained when implementing a method for producing a patterned layer of material according to another alternative to the first embodiment.

According to an alternative to the first embodiment described hereinabove, the first substrate 102 may be removed in a manner different to laser lift-off. In such a case, the stack 110 is not required to include the release layer 128. In this alternative embodiment, the intermediate layer 112 is directly produced against the first substrate 102, which may contain a semiconductor, for example silicon. FIG. 9 shows the stack 110 produced on the first substrate 102 when this stack 110 does not include the release layer 128. In this alternative embodiment, the first substrate 102 is, for example, removed by firstly implementing a planarization process from the rear face of the first substrate 102, then by etching the remaining material of the first substrate 102 selectively relative to the material of the intermediate layer 112.

According to another alternative embodiment, during the production of the stack 110, it is possible that the layer of material 100 is not a continuous layer covering the entire surface of the intermediate layer 112, but is produced in the form of a plurality of separate portions of material disposed alongside one another on the intermediate layer 112. These separate portions of the layer 100, containing, for example, InGaN, may in particular form islands intended to produce LEDs by implementing steps involving epitaxy, and the production of electrical interconnections, etc. The islands have, for example, a cross-section, in a plane parallel to the main faces of the layer 100, that is rectangular or square in shape and the sides whereof have dimensions that lie in the range 1 mm to 1 μm. The production of such islands allows relaxed, i.e. unstrained InGaN to be obtained.

The different alternative embodiments described hereinabove are not exclusive as regards one another and a plurality of these alternative embodiments can be implemented during the same method for patterning the layer 100.

A method for producing LEDs 200, during which a method for producing the patterned layer of material 100 according to a second embodiment is implemented, is described hereinbelow with reference to FIGS. 10 to 15.

Figure 10:
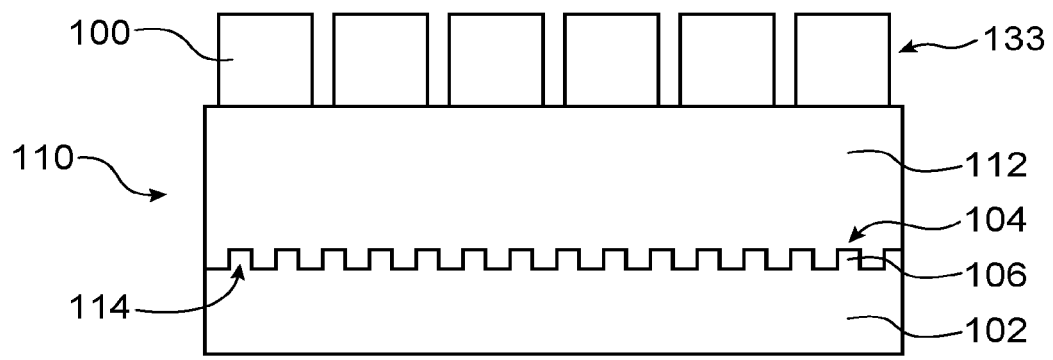
FIGS. 10-15 show the steps of a method for producing electroluminescent diodes during which a method for producing a patterned layer of material according to a second embodiment is implemented.

Similarly to the first embodiment described hereinabove, the stack 110 is produced against the patterned face 104 of the first substrate 102. In FIG. 10, the stack 110 includes the intermediate layer 112 and the layer 100 which in this case contains InGaN. The layer 100 is, in this case, produced in the form of a plurality of separate portions of material 133, for example of identical shapes and dimensions to the islands described hereinabove with reference to the first embodiment. However, unlike for this second embodiment, the layer 100 may be produced in the form of a continuous layer. The structure shown in FIG. 10 is, for example, obtained by implementing the method described in the document FR 3 056 825 A1, using a patterned substrate 102. According to another alternative embodiment, the stack 110 may include other layers of materials.

Figure 11:
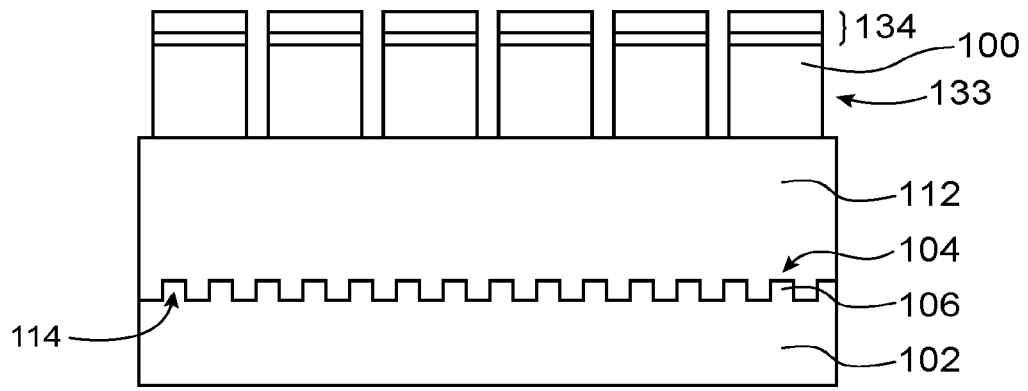

One or more other layers 134 of semiconductor materials intended to form, with the layer 100, p-n junctions of the LEDs 200 as well as the active regions of the LEDs 200 are produced on the layer 100, i.e. on each of the separate portions 133 jointly forming the layer 100 (see FIG. 11). These layers are, for example, produced by implementing placement and epitaxy steps. Similarly to the layer 100, the one or more layers 134 are produced in the form of a plurality of separate portions of material on the portions 133.

Figure 12:
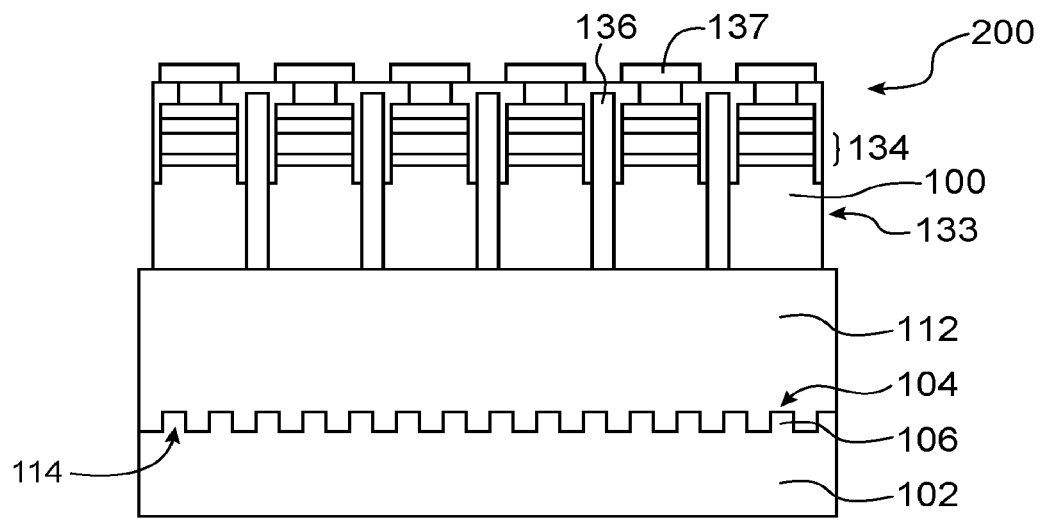

Electrodes 136, 137 are then produced such that they are in electrical contact with the n- and p-doped semi-conductor portions of the layers 100 and 134, forming the anodes and cathodes of the LEDs 200 (see FIG. 12).

The layers 100, 134 and the electrodes 136, 137 are, for example, produced in accordance with that described in the document EP 3 365 924 A1. According to one alternative embodiment, one of the two electrodes 136, 137 of each LED 200, for example the cathode, may be common to all the LEDs 200 produced on the first substrate 102.

Each semiconductor stack produced on one of the separate portions of the layer 100 may form an LED 200. Alternatively, a segmentation or partitioning process may be carried out, for example by etching, in each of these stacks to form, from each of these stacks, a plurality of LEDs 102 having smaller dimensions. For example, if each separate portion of the layer 100 has a side, the dimension whereof is equal to 500 µm, each semiconductor stack formed on each of these portions may be segmented or partitioned into a plurality of separate parts each having a side with a dimension that is less than that of the initial portions, for example equal to 10 µm.

Figure 13:
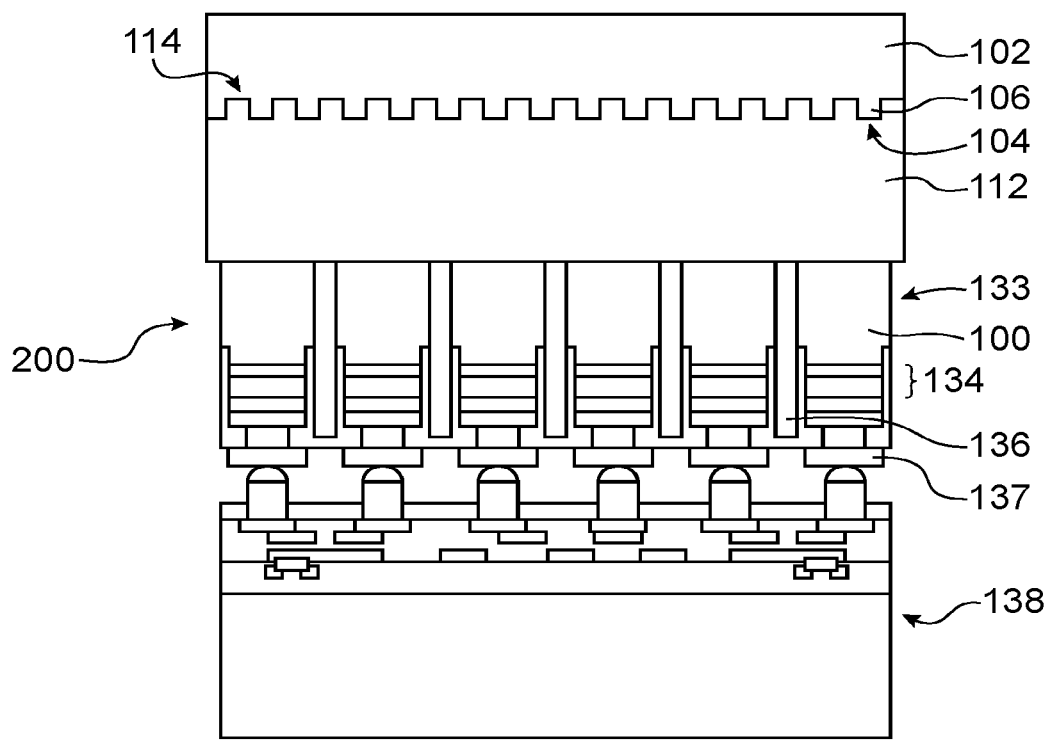

The assembly produced hereinabove is then placed on a second substrate 138 which in this case corresponds to an electronic control circuit of the LEDs 200 (see FIG. 13) intended for the passive or active addressing of the LEDs 200. The rigid connection between this electronic control circuit and the electrodes 136, 137 of the LEDs 200 is, for example, obtained by a flip chip type hybridisation method with, for example, Sn—Ag solder bumps, or any other flip chip interconnection means widely disclosed in literature. The placement on this electronic control circuit includes the production of mechanical and electrical connections between the LEDs 200 and the electronic control circuit. In FIG. 13, only the electrical connections between the electrodes 137 and the electronic control circuit are visible.

Alternatively, the LEDs 200 may be cut either individually or in groups, or modules, of a plurality of LEDs 200, then placed on the electronic control circuit.

Figure 14:
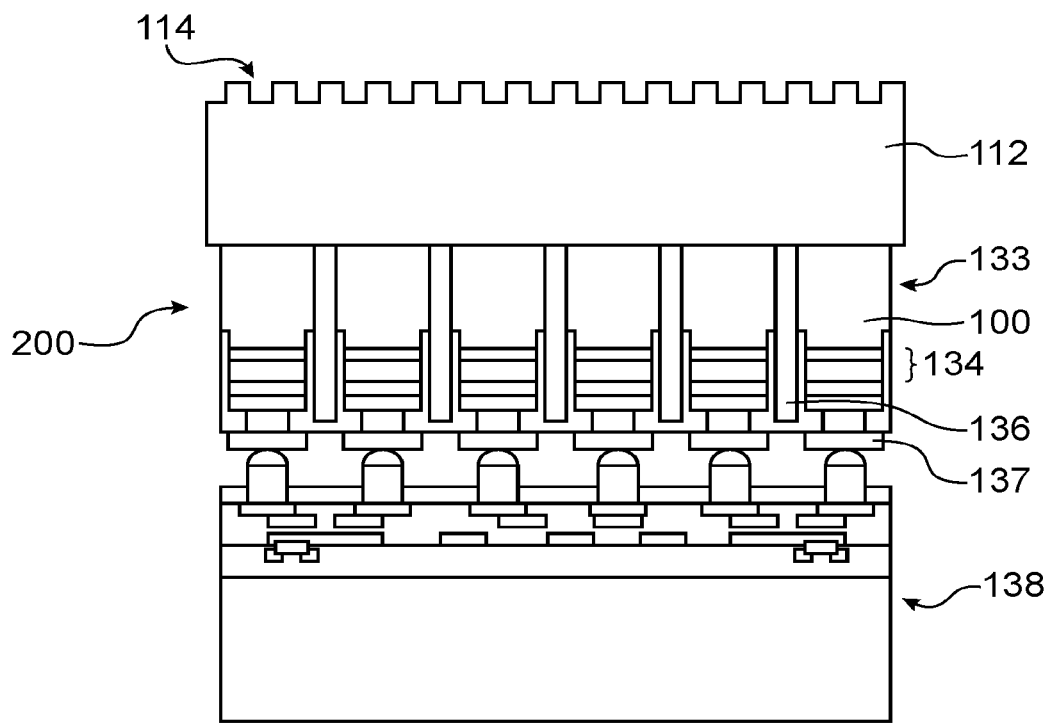

Similarly to the first embodiment, the first substrate 102 is then removed and separated from the intermediate layer 112, revealing the patterned face 114 of the intermediate layer 112 (see FIG. 14). Similarly to the first embodiment, when this removal takes place by laser lift-off, a release layer 128 is interposed between the first substrate 102 and the intermediate layer 112 when producing the stack 110.

Figure 15:
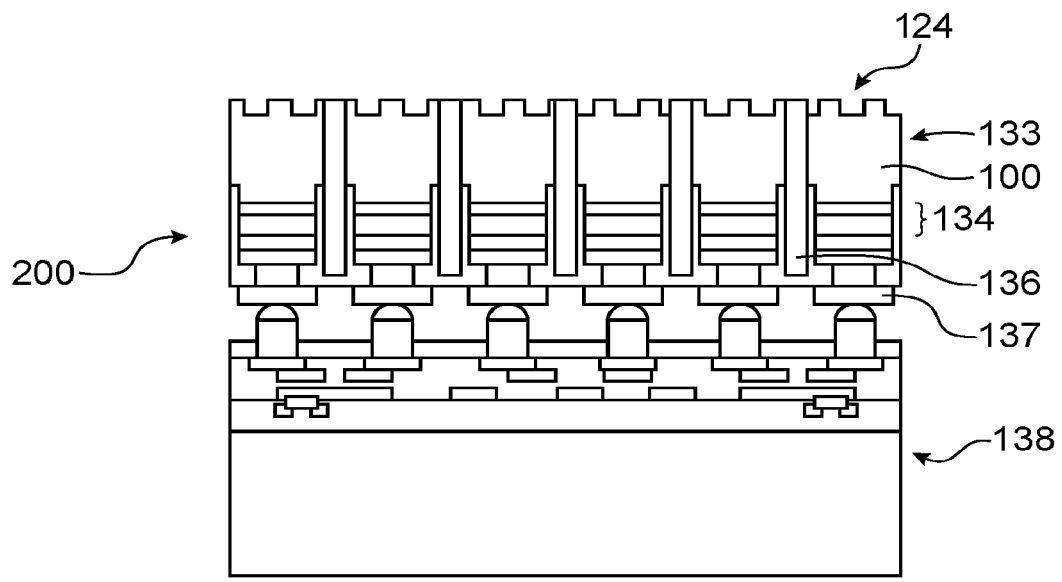

The method is completed in the same way as for the first embodiment, i.e. by anisotropically etching the intermediate layer 112 and at least part of the thickness of the layer 100 into which the patterns are transferred, from the first face 114 of the intermediate layer 112 (see FIG. 15). This etched face of the layer 100 is denoted by the reference numeral 124. This etching process includes, for example, implementing first and second etching processes similar to those described hereinabove with reference to the first embodiment.

Figure 16:
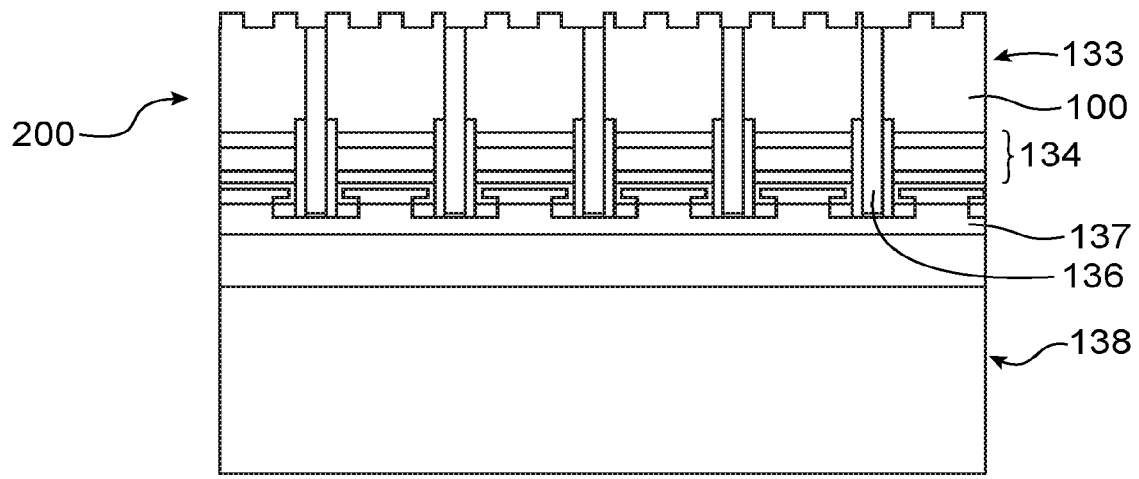
FIG. 16 shows an intermediate structure obtained when implementing a method for producing electroluminescent diodes during which a method for producing a patterned layer of material is implemented.

The LEDs 200 produced may include the anode and cathode thereof, located on the same side, i.e. on the control circuit side. Alternatively, the LEDs 200 may include a first of the two electrodes thereof, for example the anode thereof, on the control circuit side, and the second electrode thereof, for example the cathode thereof, on the opposite side, i.e. on the emissive face side. In such a case, the patterns may be produced through at least part of the thickness of this second electrode. Such diodes are referred to as VTF (Vertical Thin Film) diodes. One example embodiment of such diodes is shown in FIG. 16. In this example, the patterns are produced in the layer 100. Moreover, in the example shown in FIG. 16, the anodes are common to all of the LEDs 200.

The invention claimed is:

1. A method for producing at least one patterned layer of material, comprising at least the following steps of:
   producing a first substrate having at least one patterned face;
   producing, against the at least one patterned face of the first substrate, a stack of layers comprising at least one intermediate layer and the layer of material intended to be patterned, such that the intermediate layer is disposed between the layer of material intended to be patterned and the first substrate, and such that a first face of the intermediate layer disposed on the patterned face side of the first substrate is patterned in accordance with a design that is an inverse of that of the at least one patterned face of the first substrate, and wherein the intermediate layer does not comprise resist material;
   removing the first substrate;
   anisotropic etching the intermediate layer, implemented from the first face of the intermediate layer until parts of a face of the layer of material intended to be patterned are no longer covered by the intermediate layer and until remaining portions of the intermediate layer form a pattern, a design whereof corresponds to that of the first face of the intermediate layer; and
   etching the remaining portions of the intermediate layer and at least part of a thickness of the layer of material intended to be patterned, patterning said face of the layer of material intended to be patterned in accordance with the design of the first face of the intermediate layer.

2. The method according to claim 1, wherein the layer of material intended to be patterned contains at least one III-V semiconductor.

3. The method according to claim 1, wherein the layer of material intended to be patterned corresponds to a stack of a plurality of layers of materials.

4. The method according to claim 1, wherein the first substrate contains sapphire, the stack of layers produced against the at least one patterned face of the first substrate further includes a release layer which is disposed between the first substrate and the intermediate layer and such that a face of the release layer disposed on the intermediate layer side is patterned according to a design that is similar to that of the at least one patterned face of the first substrate, and the release layer is removed when the first substrate is removed by laser lift-off.

5. The method according to claim 1, wherein the anisotropic etching process is a reactive-ion etching process.

6. The method according to claim 1, wherein the at least one patterned face of the first substrate has protruding portions, side walls whereof form, with the surface of the first substrate on which the protruding portions are disposed, angles of greater than or equal to 90°, and/or the shape whereof is pyramidal or conical or frustoconical or dome-shaped.

7. The method according to claim 1, wherein the stack of layers produced against the at least one patterned face of the first substrate further includes a second substrate such that the layer of material intended to be patterned is disposed between the second substrate and the intermediate layer.

8. The method according to claim 7, wherein the production of the stack of layers against the at least one patterned face of the first substrate includes at least the following steps of:
producing a first part of the intermediate layer against the at least one patterned face of the first substrate;
producing the layer of material intended to be patterned on the second substrate;
producing a second part of the intermediate layer on said face of the layer of material intended to be patterned; and
rigidly connecting the first part of the intermediate layer to the second part of the intermediate layer, forming the intermediate layer.

9. The method according to claim 8, wherein the first and second parts of the intermediate layer each contain a semiconductor oxide, and wherein the rigid connection of the first part of the intermediate layer to the second part of the intermediate layer corresponds to direct bonding.

10. The method according to claim 1, wherein, during the production of the stack of layers against the at least one patterned face of the first substrate, the layer of material intended to be patterned is produced in a form of islands.

11. A method for producing electroluminescent diodes, including the implementation of a method for producing a patterned layer of material according to claim 1.

12. The method according to claim 11, wherein producing the stack of layers further comprises:
producing p-n junctions and active regions of the electroluminescent diodes including producing semiconductor layers formed by epitaxy on the layer of material intended to be patterned, and producing electrodes electrically connected to the p-n junctions.

13. The method according to claim 12, wherein the stack of layers produced against the at least one patterned face of the first substrate further includes a second substrate such that the p-n junctions and the active regions are disposed between the second substrate and the intermediate layer, the second substrate comprising an electronic control circuit to which the electrodes are connected.

14. The method according to claim 13, further comprising, between the production of the electrodes and the production of the second substrate, forming electroluminescent diode modules, each including one or more electroluminescent diodes, one or more modules then being individually or collectively rigidly connected to the second substrate.

15. The method according to claim 1, wherein the first substrate contains a semiconductor or a non-transparent material, and is removed by planarization and chemical etching that is selective relative to the intermediate layer.

16. The method according to claim 2, wherein the at least one III-V semiconductor comprises one of the following semiconductors: GaN, InGaN, InP, AlGaN, GaP, GaAs, InGaAs, AlGaS, AlGaInN, and AlGaInP.

17. The method according to claim 1, comprising completely etching the remaining portions.

18. The method according to claim 1, comprising:
forming a release layer on the at least one patterned face; and
removing the first substrate using the release layer.

19. A method for producing at least one patterned layer of material, comprising at least the following steps of:
producing a first substrate having a first patterned face, a first layer disposed in contact with the patterned face, and a second layer disposed on the first layer;
producing a second substrate having a third layer to be patterned formed on the second substrate and a fourth layer disposed on the third layer;
bonding the second layer and the fourth layer;
separating the first substrate and the second substrate using the first layer, transferring at least a portion of the second layer to the second substrate, the portion having a second patterned face complementary to the first patterned face;
etching the portion of the second layer and the fourth layer to expose the third layer; and
etching the third layer.

20. The method according to claim 19, wherein:
etching the portion comprises anisotropically etching the portion of the second layer and the fourth layer to expose the third layer and form remaining portions of the fourth layer, the remaining portions forming a pattern corresponding to the first patterned face; and
etching the third layer comprises etching the remaining portions and at least part of a thickness of the third layer forming a pattern corresponding to the first patterned face of the substrate.

21. The method according to claim 19, wherein separating the first substrate and the second substrate using the first layer comprises removing the first layer.

22. A method for producing at least one patterned layer of material, comprising at least the following steps of:
producing a first substrate having at least one patterned face;
producing, against the at least one patterned face of the first substrate, a stack of layers comprising at least one intermediate layer and the layer of material intended to be patterned, such that the intermediate layer is disposed between the layer of material intended to be patterned and the first substrate, and such that a first face of the intermediate layer disposed on the patterned face side of the first substrate is patterned in accordance with a design that is an inverse of that of the at least one patterned face of the first substrate, and wherein the intermediate layer comprises a semiconductor oxide;
removing the first substrate;
anisotropic etching the intermediate layer, implemented from the first face of the intermediate layer until parts of a face of the layer of material intended to be patterned are no longer covered by the intermediate layer and until remaining portions of the intermediate layer form a pattern, a design whereof corresponds to that of the first face of the intermediate layer; and
etching the remaining portions of the intermediate layer and at least part of a thickness of the layer of material intended to be patterned, patterning said face of the layer of material intended to be patterned in accordance with the design of the first face of the intermediate layer.

23. The method according to claim 22, comprising completely etching the remaining portions.

* * * * *